United States Patent [19]

Staudinger et al.

[11] Patent Number: 5,128,638
[45] Date of Patent: Jul. 7, 1992

[54] FOUR-POST QUADRATURE COUPLER SUITABLE FOR MONOLITHIC IMPLEMENTATION

[75] Inventors: Joseph Staudinger; William B. Beckwith; Warren L. Seely, all of Chandler, Ariz.

[73] Assignee: Motorola, Inc., Schaumburg, Ill.

[21] Appl. No.: 620,692

[22] Filed: Dec. 3, 1990

[51] Int. Cl.$^5$ .............................. H01P 5/18
[52] U.S. Cl. ................... 333/109; 333/118
[58] Field of Search .............. 333/25, 26, 109, 112, 333/118, 119, 124, 138, 156, 23, 100

[56] References Cited

U.S. PATENT DOCUMENTS

| | | | |
|---|---|---|---|
| 3,781,718 | 12/1973 | Gittinger | 333/118 |
| 4,330,868 | 5/1982 | Hallford | 333/26 |
| 4,893,098 | 1/1990 | Seely | 333/112 |
| 4,992,761 | 2/1991 | Seely | 333/118 |
| 5,023,376 | 6/1991 | Staudinger | 333/25 |
| 5,045,821 | 9/1991 | Staudinger | 333/118 |

Primary Examiner—Eugene R. LaRoche
Assistant Examiner—Amir Zarabian
Attorney, Agent, or Firm—Frank J. Bogacz

[57] ABSTRACT

A method for creating a four-port quadrature coupler suitable for monolithic implementation which involves connecting two ports of a balun, suitable itself for implementation in monolithic microwave integrated circuits, to two separate phasing networks. A device exhibiting the proper four-port quadrature coupler characteristics within a MMIC structure results, with wide bandwidth exceeding one octave.

16 Claims, 2 Drawing Sheets

FOUR-POST QUADRATURE COUPLER SUITABLE FOR MONOLITHIC IMPLEMENTATION

BACKGROUND OF THE INVENTION

This invention relates in general to the field of couplers, and in particular to four-port quadrature couplers.

Four-port quadrature couplers are an important building block for many electrical components. They are an essential sub-circuit in many components such as mixers, phase detectors, balanced amplifiers, and vector modulators used in many commercial and military electrical systems.

Quadrature couplers have been implemented in various technologies based on a number of designs and topologies. At microwave and UHF frequencies above one GigaHertz (1 GHz) most quadrature coupler topologies are based on distributed elements. Two common topologies are the branch line coupler and coupled transmission line sections. However, quadrature couplers formed using distributed elements require relatively large circuit area especially at lower microwave frequencies on the order of 1-10 GHz. In coupled transmission line form, for example, each transmission line of the quadrature coupler is one-quarter wavelength long at the center operating frequency for the device. Thus, the size of the circuits is directly proportional to wavelength and inversely proportional to frequency, whereby circuits operating at lower frequencies require larger area.

Because a traditional method such as transmission line structure may require a length on the order of one inch (1 in.) at a center frequency of one GigaHertz (1 GHz), and because monolithic microwave integrated circuits (MMICs) often are only one-tenth of an inch (0.1 in.) or smaller on a side, the transmission line approach to making a quadrature coupler on MMICs is impractical for frequencies of 10 GHz or lower. It is an extreme cost disadvantage to add gallium arsenide substrate to create a structure of sufficient length to use the transmission line topology at such frequencies. And, because branch line methods rely on uncoupled transmission lines requiring an even greater circuit area, they are even less practical at frequencies below 10 GHz. Microwave circuits on MMIC below 7 or 8 GHz often do without quadrature couplers entirely.

Another approach to construction of quadrature couplers is to use lumped element topologies, using inductors and capacitors. While lumped element circuits are suitable for MMIC application, they are often limited to one input and two output (i.e., three-port) configurations. Lumped element quadrature couplers therefore typically do not fulfill the need of a four-port quadrature coupler for MMICs.

An additional shortcoming of quadrature couplers is often limited bandwidth. While some lumped element four-port couplers are possible, they exhibit narrow bandwidth. The coupler in U.S. Pat. No. 4,893,098, "90 Degree Broadband MMIC Hybrid", by Seely and Staudinger, issued on Jan. 9, 1990 to the same assignee as the present application, although suitable for MMIC application, is limited to bandwidths of less than an octave.

Thus, what is needed is a method for providing a four-port quadrature coupler which can exhibit wide bandwidth exceeding an octave and which is suitable for monolithic implementation at frequencies less than 10 GHz.

SUMMARY OF THE INVENTION

Accordingly, it is an advantage of the present invention to provide a four-port quadrature coupler suitable for monolithic implementation. It is also an advantage to provide the coupler with wide bandwidth characteristics capable of exceeding one octave. Finally, it is an advantage of the invention to be suitable for use at frequencies of less than 10 GHz without resorting to topologies using transmission lines.

To achieve these advantages, a method for creating a four-port quadrature coupler suitable for monolithic implementation is contemplated which involves connecting two ports of a balun, suitable itself for implementation in monolithic microwave integrated circuits, to two separate phasing networks. A device capable of implementation at less than 10 GHz and exhibiting the proper four-port quadrature coupler characteristics within a MMIC structure results. The quadrature coupler exhibits a wide bandwidth, capable of exceeding one octave.

The above and other features and advantages of the present invention will be better understood from the following detailed description taken in conjunction with the accompanying drawings.

DETAILED DESCRIPTION OF THE PREFERRED EMBODIMENT

Figure 1:
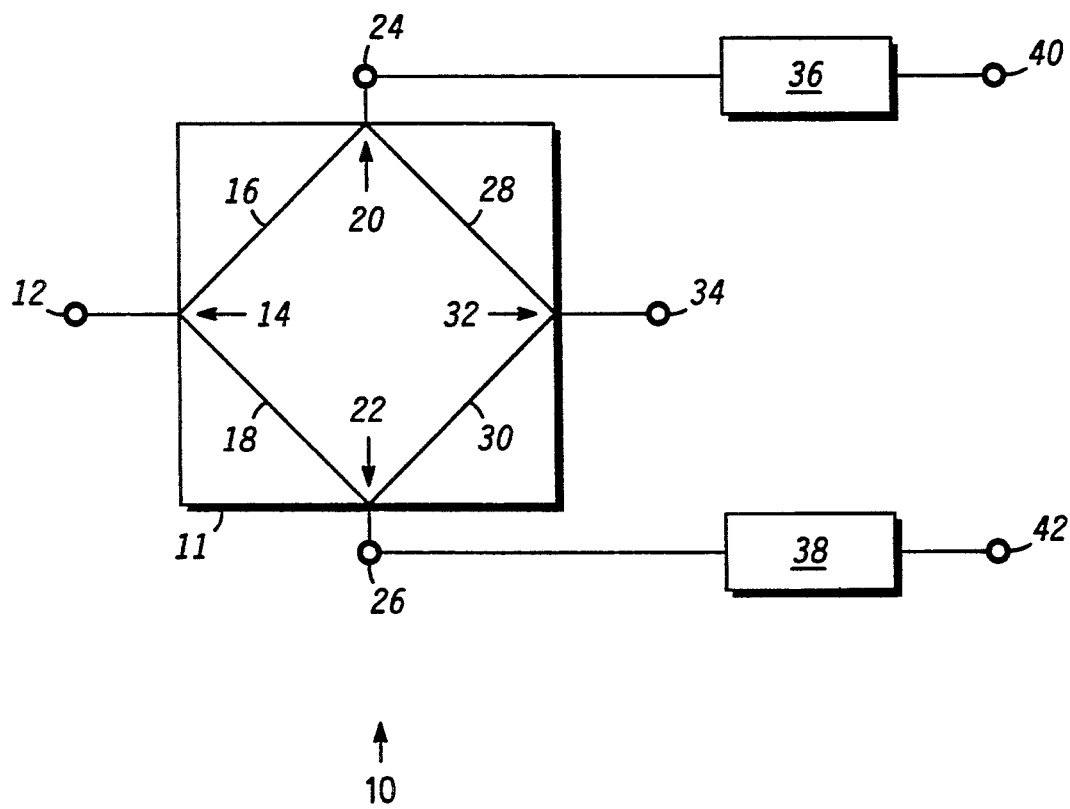
In FIG. 1, there is shown a general schematic view of the preferred embodiment of the invention.

In FIG. 1, there is shown a general schematic diagram of a four-port quadrature coupler in accordance with the present invention, comprising a balun 11, phasing network 36, and phasing network 38. The balun 11 has four input-output terminals labeled 12, 24, 26, and 34. The balun 11 itself must have four ports and be suitable for monolithic implementation. Such a balun is described in Pat. application "Broadband 180 Degree Hybrid", Ser. No. 445,307, filed Dec. 4, 1989 by Seely and Staudinger.

Input-output terminal 12 of balun 11 is connected to the first branch point of the balun circuitry at terminal branch 14. A portion of the signal input to the terminal branch 14 travels though the phase-shifter 16 of the balun, and the remainder of the signal travels through the phase-shifter 18. The signal through the phase shifter 16 arrives at a second branch point in the balun circuit at 20. The branch point 20 is connected to a phase shifter 28 as well as to input-output terminal 24. Similarly, the signal through the phase shifter 18 arrives at a third branch point 22. The branch point 22 is connected to a phase shifter 30 as well as to input-output terminal 26. The paths through the phase shifter 28 and the phase shifter 30 combine at a fourth branch point of the balun circuitry 32, from which a input-output terminal 34 also emanates.

The input-output terminal 24 is additionally connected to a phasing network 36. A signal traveling through the phasing network 36 proceeds to a input-output terminal 40. Similarly, input-output terminal 26 is additionally connected to a phasing network 38. A signal traveling through the phasing network 38 proceeds to a input-output terminal 42.

In operation, a four-port quadrature coupler functions so as to process a signal input to one of its four ports into output signals which are of equal amplitude and 90 degrees different in phase at two of the other three input-output terminals, with the fourth port isolated. Thus, for example, for an input signal at input-output terminal 12, input-output terminal 40 and input-output terminal 42 exhibit output signals of equal amplitude with relative phase difference of 90 degrees, with input-output terminal 34 isolated.

Figure 2:
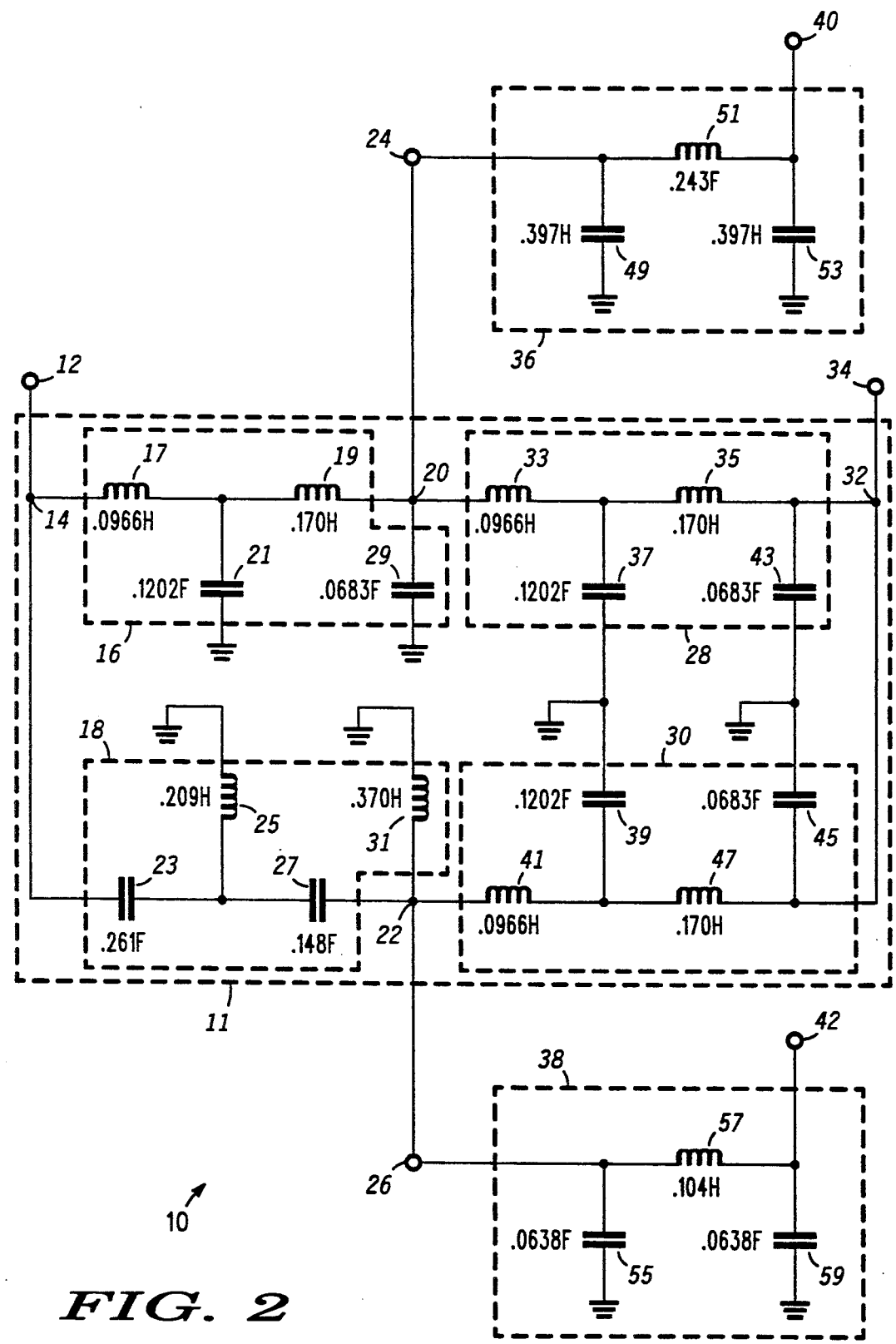
FIG. 2 is a detailed circuit view of the preferred embodiment of the invention.

FIG. 2, illustrates the detailed circuit view for the preferred embodiment of the invention schematically represented in FIG. 1. Note that the lumped elements used have component values that are normalized to one ohm ($\Omega$) and one Hertz (Hz). The phase shifter 16 comprises a circuit path connecting 0.096 Henry (H) inductor 17, 0.170 H inductor 19, 0.1202 Farad (F) capacitor 21, and 0.0683 F capacitor 29 as shown. The phase shifter 18 comprises a circuit path connecting 0.261 F capacitor 23, 0.209 H inductor 25, 0.148 F capacitor 27, and 0370 H inductor 31 as shown. The phase shifter 28 comprises a circuit path connecting 0.0966 H inductor 33, 0.1202 F capacitor 37, 0.0170 H inductor 35, and 0.0683 F capacitor 43 as shown. The phase shifter 30 comprises 0.0966 H inductor 41, 0.1202 F capacitor 39, 0.170 H inductor 47, and 0.0683 F capacitor 45 connected as shown.

Similarly, the phasing network 36 comprises a circuit path connecting 0.397 H inductor 49, 0.243 F capacitor 51, and 0.397 H inductor 53 as shown. Phasing network 38 comprises a circuit path connecting 0.0638 F capacitor 55, 0.104 H inductor 57, and 0.0638 F capacitor 59 as shown.

In operation, the four ports of the quadrature coupler are input-output terminals 12, 40, 42, and 34. The balun 11 divides an incident signal at input-output terminal 12 which exits at input-output terminal 24 and input-output terminal 26 as output signals of equal amplitude and 180-degree relative phase differential. Similarly, an incident signal at input-output terminal 34 is divided and exits input-output terminal 24 and input-output terminal 26 as output signals of equal amplitude and 0-degree relative phase differential. The phase-shifting networks 36 and 38 exhibit +45 degrees and +45 degrees insertion phase, respectively. Thus, an incident signal at input-output terminal 12 is split and exits input-output terminal 40 and input-output terminal 42 as output signals of equal amplitude and 90-degree relative phase differential. Input-output terminal 34 is isolated.

Similarly, an incident signal at input-output terminal 34 is split and exits input-output terminal 40 and input-output terminal 42 as output signals of equal amplitude and 90-degree relative phase differential. Also, incident signals at input-output terminal 40 and input-output terminal 42 are vectorially combined and exit the input-output terminal 12 and/or input-output terminal 34. Thus, the electrical performance of the device is characteristic of a four-port quadrature coupler.

Numerous topologies are possible for the balun 11 and phase shift networks 36 and 38 depending on the selected technology and operating frequency. The balun 11 can be realized using conventional topologies including "rat race" ring, double lange coupler, Marchand balun, and parallel-coupled line balun, among others, for operation at microwave frequencies, and, for example, ferrite transformer methods at ultra-high frequencies (UHF). Similarly, lumped or distributed low and high pass filters are examples of topologies that can be used to implement phase shift networks 36 and 38 depending on the technology and frequency.

To implement this coupler on MMIC at frequencies in the approximate range of 1 GHz to 10 GHz, the balun 11 can be as referred to above in patent application serial number 445,307. The phase shift networks 36 and 38 can be implemented as lumped and/or distributed element high and low pass filters of specified order (for example, third). The order is chosen on constraints such as bandwidth, amplitude, and phase performance requirements. The component values for inductors 17, 19, 25, 31, 33, 35, 41, 47, 49, 53, and 57 and for capacitors 21, 23, 27, 29, 37, 39, 43, 45, 51, 55, and 59 must be appropriately scaled in frequency and impedance from their normalized values. Also, some adjustment in values can be required to compensate for structural parasitics. Anticipated insertion loss of this coupler is 4.5 deciBels (dB) with an insertion phase error of less than 5 degrees.

The criteria for selection of the topology and values for low and high pass phase shift networks 36 and 38 involves determining the response for the filter. Consider first an nth order low pass network which is normalized in frequency (1 radian/second) and impedance (1 $\Omega$). For a Chebychev response with a specified pass band ripple, $A$max, and assuming zero offset constrains the transducer power gain between 1 and $1/(1+\epsilon^2)$. To determine insertion phase response, pole locations can be computed, as in the following equations, by decomposing the denominator of equation (1), resulting in equation (2):

$$|S_{21}(s)|^2 = \frac{H_0}{(1 + \epsilon^2 C_n^2(s))} \quad (1)$$

$$1 + \epsilon^2 C_n^2(s) = \epsilon^2 2^{2n-2} p(s) p(-s) \quad (2)$$

$$\epsilon = (10^{A max/10} - 1)^{0.5} \quad (3)$$

where
$S_{21}$ is the transmission coefficient,
$A$max is the passband ripple in dB,
$H_O$ is a constant,
n is the network order or number of poles,
s is the frequency variable (s=jw),
$C_n(s)$ is the generalized Chebychev polynomial, and
p(s) is the Hurwitz polynomial.
and $\epsilon$ is the parameter in the constraint of transducer power, defined in terms of $A_{max}$.

The insertion phase response of the low pass filter can be determined by considering the left half of the complex frequency (S) plane (i.e., LHS) poles of the Hurwitz polynomial. From the pole locations given by the following equations (4)–(7), the insertion phase as a function of frequency can be calculated by equation (8):

$$s_k = \sigma_k + jw_k, k = 1, 2, 3, \ldots, n \quad (4)$$

$$\sigma_k = -\sinh(a)\sin\left[\frac{((2k-1)\pi)}{2n}\right], k = 1, 2, 3, \ldots, n \quad (5)$$

$$w_k = \cosh(a)\cos\left[\frac{((2k-1)\pi)}{2n}\right], k = 1, 2, 3, \ldots, n \quad (6)$$

-continued
$$a = (1/n)\sinh^{-1}(1/\epsilon) \quad (7)$$

$$\phi_{lp(w)} = -\tan\left[\frac{(w-w_1)}{\sigma_1}\right] - \tan\left[\frac{(w-w_2)}{\sigma_2}\right] - \ldots \\ -\tan\left[\frac{(w-w_n)}{\sigma_n}\right] \quad (8)$$

where $\sigma$ is the real part and $w_k$ is the imaginary part of the pole location $s_k$ and $\phi_{lp}(w)$ is the insertion phase response of the low-pass filter.

The phase response $S_{21}$ of the high pass network can be determined in a similar manner. However, considering the network transformation required for low to high pass, the following equality holds:

$$\phi_{hp}(w) = -\phi_{lp}(1/w) \quad (9)$$

where $\phi_{hp}(w)$ is the insertion phase response of the high-pass filter.

Equations (8) and (9) allow computing the phase response $S_{21}$ for both low and high pass networks given a prescribed network order n and passband ripple $A_{max}$. For the networks considered, n is fixed to three (third order "$\pi$" or "T"). Equations (8) and (9) also provide the basis to determine component values for each network. With a specified passband ripple $A_{max}$, the cut-off frequencies of the low and high pass networks are adjusted to satisfy the following constraints, resulting in a 90 degree phase differential for the coupler:

$$\phi_{hp}(w_0) - \phi_{lp}(w_0) = 90^0 - \phi_e \quad (10)$$

$$\phi_{hp}(w_{cp}) - \phi_{lp}(w_{cp}) = 90^0 - \phi_e \quad (11)$$

$$\phi_{hp}(1/w_{cp}) - \phi_{lp}(1/w_{cp}) = 90 - \phi_e \quad (12)$$

where $\phi_e$ is the phase error from 90 degrees, $w_0$ is the center operating frequency, and $w_{cp}$ and $1/w_{cp}$ are the band-edge frequencies for the phase responses of the low-pass and high-pass networks, respectively.

Thus, the phase of the low pass network relative to the high pass network is 90 degrees $\pm\phi_e$ from frequencies $(1/w_{cp})$ to $w_{cp}$. Similarly, an amplitude bandwidth is defined from frequencies $1/w_{ca}$ to $w_{ca}$. Hence, for normalized center frequency, a fractional bandwidth can be defined for both amplitude ($BW_{amp}$) and phase ($BW_{phase}$), as follows:

$$BW_{amp} = w_{ca} - (1/w_{ca}) \quad (13)$$

$$BW_{phase} = w_{cp} - (1/w_{cp}) \quad (14)$$

Thus, a four-port quadrature coupler technology has been described which overcomes specific problems and accomplishes certain advantages relative to prior art methods and mechanisms. The improvements over known technology are significant. Typical quadrature couplers based on distributed elements such as branch lines and coupled transmission lines are generally too large in size for MMIC implementation except at frequencies above 10 GHz. The present embodiment of the invention can be implemented on MMIC using primarily lumped elements in a reasonable circuit area. The present embodiment of the invention can also exhibit wide bandwidth operation, exceeding an octave. Other known quadrature couplers, even if suitable for MMIC implementation, are limited by the lack of a fourth port, or are limited to bandwidths less than an octave.

Thus, there has been provided, in accordance with an embodiment of the invention, a four-port quadrature technology suitable for monolithic implementation that fully satisfies the aims and advantages set forth above. While the invention has been described in conjunction with a specific embodiment, many alternatives, modifications, and variations will be apparent to those of ordinary skill in the art in light of the foregoing description. For example, additional embodiments of the invention can be suitable for planar microwave integrated circuit technology, in which the balun 11 can be implemented as a rat race topology and the phase shift networks 36 and 38 as distributed networks. At UHF frequencies, toroidal and lumped components could be used. Accordingly, the invention is intended to embrace all such alternatives, modifications, and variations as fall within the spirit and broad scope of the appended claims.

We claim:

1. A method for making a four-port device to shift the phase of an input electromagnetic signal using a balun, first phasing network, and second phasing network comprising the steps of:
   coupling a first balun port to the first phasing network;
   coupling a second balun port to the second phasing network;
   providing a third balun port as a first device port;
   providing a fourth balun port as a second device port;
   providing a third device port from the first phasing network; and
   providing a fourth device port from the second phasing network.

2. The method as claimed in claim 1 wherein there is further included the step of implementing the four-port phase-shifting device in monolithic microwave integrated circuits.

3. The method as in claim 1 wherein there is further included the step of providing the balun, first phasing network, and second phasing network suitable for processing an electromagnetic signal of frequency less than ten GigaHertz (10 GHz).

4. The method as in claim 1 wherein there is further included the step of:
   providing the first device port as an input;
   obtaining output signals from the third device port and fourth device port of equal amplitude and ninety (90) degree relative phase difference; and
   obtaining the second device port isolated from the other device ports.

5. The method as in claim 1 wherein there is further included the steps of:
   implementing the first phasing network as a high-pass filter; and
   implementing the second phasing network as a low-pass filter with a common passband to the high-pass filter of the first phasing network.

6. A four-port electromagnetic signal phase-shifting device, comprising:
   a balun including a first balun port, a second balun port, a third balun port and a fourth balun port;
   a first phasing network means including a first and a second terminal means;
   a second phasing network means including a first and a second terminal means;
   the first terminal means of the first phasing network coupled to the first balun port;

the first terminal means of the second phasing network coupled to the second balun port;

the third balun port being a first device port;

the fourth balun port being a second device port;

the second terminal means of the first phasing network providing a third device port;

the second terminal means of the second phasing network providing a fourth device port; and the four-port electromagnetic signal phase-shifting device providing a bandwidth capable of exceeding one octave.

7. The device according to claim 6 wherein:

the first device port is the input;

the third device port and the fourth device port are outputs of equal amplitude and ninety (90) degree relative phase difference; and the second device port is isolated from the other device ports.

8. The device according to claim 6 wherein:

the third device port is the input;

the first device port and the second device port are outputs of equal amplitude and ninety (90) degree relative phase difference; and the fourth device port is isolated from the other device ports.

9. The device according to claim 6 in monolithic microwave integrated circuit implementation.

10. The device according to claim 6 wherein the frequency of the electromagnetic signal used by the device is less than ten GigaHertz (10 GHz).

11. The device according to claim 6 wherein:

the first phasing network means comprises a high-pass filter; and the second phasing network means comprises a low-pass filter with a common passband to the high-pass filter of the first phasing network.

12. The device according to claim 6 wherein the bandwidth exhibited is capable of exceeding one octave.

13. A four-port, monolithic microwave integrated circuit, electromagnetic signal phase-shifting device operating at frequencies less than ten GigaHertz (10 GHz), comprising:

first input-output means being a first device port;

second input-output means coupled to the first input-output means by a first phase-shifting means;

third input-output means coupled to the first input-output means by a second phase-shifting means;

fourth input-output means coupled to the second input-output means by a third phase-shifting means;

the fourth input-output means coupled to the third input-output means by a fourth phase-shifting means;

the fourth input-output means being a second device port;

the second input-output means coupled to a first phasing network means;

the third input-output means coupled to a second phasing network means;

the first phasing network means coupled to a fifth input-output means;

the fifth input-output means being a third device port;

the second phasing network means coupled to a sixth input-output means;

the sixth input-output means being a fourth device port; and the four-port electromagnetic signal phase-shifting device providing a bandwidth capable of exceeding one octave.

14. The device according to claim 13 wherein:

the first device port is the input;

the third device port and the fourth device port are outputs of equal amplitude and ninety (90) degree relative phase difference; and the second device port is isolated from the other device ports.

15. The device according to claim 13 wherein:

the third device port is the input;

the first device port and the second device port are outputs of equal amplitude and ninety (90) degree relative phase difference; and the fourth device port is isolated from the other device ports.

16. The device according to claim 14 wherein:

the first phasing network means comprises a high-pass filter; and the second phasing network means comprises a low-pass filter with a common passband to the high-pass filter of the first phasing network.

* * * * *